United States Patent
Usui et al.

(10) Patent No.: US 9,789,674 B2
(45) Date of Patent: Oct. 17, 2017

(54) BONDING DEVICE AND METHOD FOR PRODUCING PLATE-SHAPED BONDED ASSEMBLY

(75) Inventors: Hiroyuki Usui, Tochigi (JP); Yoshihisa Shinya, Tochigi (JP); Yasumi Endo, Tochigi (JP)

(73) Assignee: Dexerials Corporation, Tokyo (JP)

(*) Notice: Subject to any disclaimer, the term of this patent is extended or adjusted under 35 U.S.C. 154(b) by 418 days.

(21) Appl. No.: 13/500,537

(22) PCT Filed: Oct. 4, 2010

(86) PCT No.: PCT/JP2010/067369
§ 371 (c)(1),
(2), (4) Date: Jun. 25, 2012

(87) PCT Pub. No.: WO2011/043295
PCT Pub. Date: Apr. 14, 2011

(65) Prior Publication Data
US 2012/0247644 A1    Oct. 4, 2012

(30) Foreign Application Priority Data

Oct. 7, 2009  (JP) .................................. 2009-232963

(51) Int. Cl.
*B32B 41/00*     (2006.01)
*B32B 37/12*     (2006.01)
(Continued)

(52) U.S. Cl.
CPC ...... *B32B 37/1284* (2013.01); *B29C 65/1435* (2013.01); *B29C 65/1448* (2013.01);
(Continued)

(58) Field of Classification Search
CPC ............ B32B 37/1284; B29C 65/1435; B29C 65/1448; B29C 65/1483; B29C 65/4845;
(Continued)

(56) References Cited

U.S. PATENT DOCUMENTS

2004/0134603 A1*  7/2004  Kobayashi et al. ....... 156/272.8
2007/0262936 A1*  11/2007 Chang .................. B29C 59/026
345/87

FOREIGN PATENT DOCUMENTS

JP      3-116459 A     5/1991
JP      5-020714 A     1/1993
(Continued)

OTHER PUBLICATIONS

International Search Report w/translation from PCT/JP2010/067369 dated Nov. 2, 2010 (6 pages).

*Primary Examiner* — Michael N Orlando
*Assistant Examiner* — Elizabeth Bradford
(74) *Attorney, Agent, or Firm* — Osha Liang LLP

(57) ABSTRACT

A bonding device for charging a liquid material into a space between plate-shaped members for bonding them together in situ, in which the liquid material may be prevented from exuding from the space between the plate-shaped members. The bonding device includes pair retaining base members for retaining the pair plate-shaped members facing each other, and a retaining base member movement unit for causing movement of the retaining base members towards and away from each other. The bonding device also includes an illumination unit that illuminates curing light to a photocurable liquid material charged between the pair plate-shaped members held by the pair retaining base members, and a sensor that detects the wetting spreading state of the liquid material charged between the pair plate-shaped members.

9 Claims, 11 Drawing Sheets

(51) Int. Cl.
  *H01J 37/32* (2006.01)
  *B29C 65/14* (2006.01)
  *B29C 65/48* (2006.01)
  *B29C 65/52* (2006.01)
  *B29C 65/00* (2006.01)
  *G02F 1/13* (2006.01)
  *B29C 65/78* (2006.01)
  *G02F 1/1341* (2006.01)
  *B29L 31/34* (2006.01)

(52) U.S. Cl.
  CPC ...... *B29C 65/1483* (2013.01); *B29C 65/4845* (2013.01); *B29C 65/524* (2013.01); *B29C 66/324* (2013.01); *B29C 66/342* (2013.01); *B29C 66/343* (2013.01); *B29C 66/3452* (2013.01); *B29C 66/45* (2013.01); *B29C 66/73366* (2013.01); *B29C 66/7465* (2013.01); *B29C 66/81267* (2013.01); *B29C 66/8322* (2013.01); *G02F 1/1303* (2013.01); *H01J 37/32321* (2013.01); *B29C 65/1454* (2013.01); *B29C 65/1464* (2013.01); *B29C 65/7847* (2013.01); *B29L 2031/3475* (2013.01); *B32B 2310/0831* (2013.01); *B32B 2457/202* (2013.01); *G02F 1/1341* (2013.01)

(58) Field of Classification Search
  CPC ..... B29C 65/524; B29C 66/342; B29C 66/45; B29C 66/73366; B29C 66/8322; G02F 1/1303
  USPC ...................................... 156/272.2
  See application file for complete search history.

(56) References Cited

FOREIGN PATENT DOCUMENTS

| | | |
|---|---|---|
| JP | 2002-254010 A | 9/2002 |
| JP | 2006-134545 A | 5/2006 |
| JP | 2009-008851 A | 1/2009 |

* cited by examiner

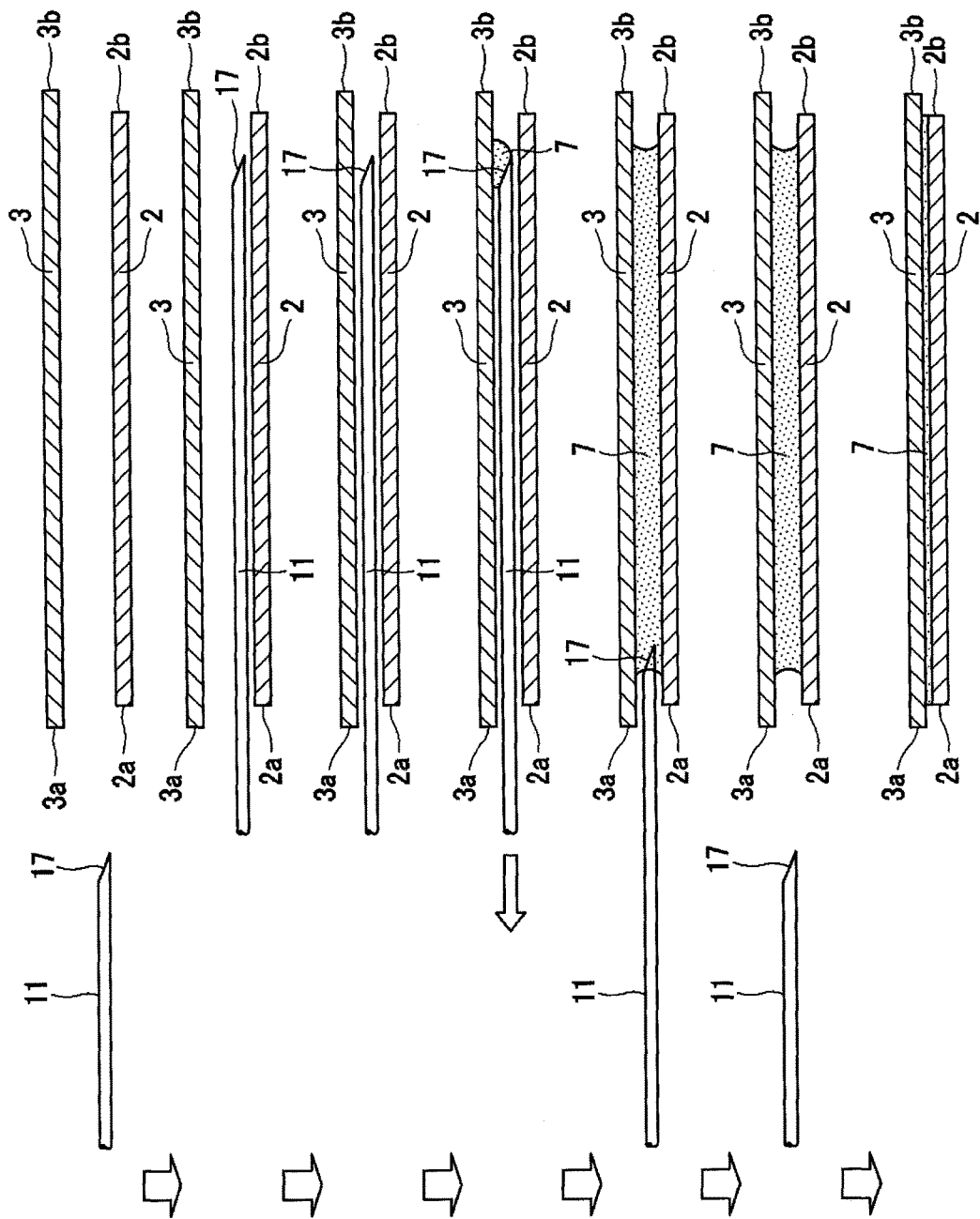

BONDING DEVICE AND METHOD FOR PRODUCING PLATE-SHAPED BONDED ASSEMBLY

CROSS REFERENCE TO RELATED APPLICATION

This is a national stage application of PCT/JP2010/067369, filed on Oct. 4, 2010, which claims the priority of Japanese Patent Application No. 2009-232963, filed on Oct. 7, 2009. This application claims benefits and priority of these prior filed applications and incorporates the disclosures of these prior applications by reference in their entirety.

TECHNICAL FIELD

This invention relates to a bonding device for charging a liquid material into a space between plate-shaped members for bonding in situ. More particularly, it relates to a bonding device for charging a photo-curable resin liquid material into a space between two plate-shaped members, such as a picture image display panel and a transparent protective panel, to prepare a plate-shaped bonded assembly.

The present application asserts priority rights based on JP Patent Application 2009-232963 filed in Japan on Oct. 7, 2009. The total contents of disclosure of the patent application of the senior filing date are to be incorporated by reference into the present application.

BACKGROUND ART

In a display part with a liquid crystal module, hitherto used in a variety of display devices, such as liquid crystal television or a mobile phone, a gap of 0.5 to 1 mm is provided between the surface of a panel of a liquid crystal module and a transparent protective cover, such as an acrylic plate, placed thereabove. If, in this structure, the protective cover is broken by shock from outside, the liquid crystal module may remain unaffected.

In such air gap structure, a liquid crystal panel of the liquid crystal module, an air layer of the air gap and the protective cover of glass or plastics, are layered in this order. These are different in refractive indices. Thus, light reflection occurs at an interface between the liquid crystal panel and the air layer, an interface between the air layer and the protective cover and at an interface between the protective cover and outside atmosphere, thus occasionally lowering luminance or contrast ratio due to light scattering. For example, display on the liquid crystal panel may not be seen with ease under insolation.

To cope with such problem, there is known a technique in which an air gap structure is not used and a transparent optical resin whose refractive index is close to that of glass or acryl is sealed into between the liquid crystal panel and the protective cover and cured in situ by UV light illumination. In case the air gap is filled with the optical resin, the interface between the liquid crystal panel and the air layer or the interface between the air layer and the protective cover is substantially eliminated and no light reflection or scattering occurs at these interfaces. It is thus possible to make improvement in contrast ratio or luminance of the display on the liquid crystal panel appreciably.

If, in such optical resin charged structure, the optical resin is charged into between the liquid crystal panel and the protective cover, it is demanded that the optical resin is charged in a state free from mixing of air foam. It is also demanded that the optical resin is not exuded out of the gap between the liquid crystal panel 2 and the protective panel 3 so as not to affect neighboring elements.

Methods and devices for coating and curing the optical resin have also been developed (see Patent Document 1). In these devices, a transparent optical resin is coated in the vicinity of outer lateral side edges of the protective cover retained by a loader. This optical resin is semi-cured to form a dam. The optical resin is coated on the entire surface of the protective cover, which is topsy-turvied and retained. A liquid crystal panel is placed facing and contacted with the surface of the protective cover coated with the optical resin to spread out the resin in a gap between the two panels. At this time, the spread-out resin is stopped by the dam formed in the vicinity of the outer lateral side edge of the protective cover, thus preventing the resin from exuding from the gap between the two panels. After the optical resin has been spread out over the entire areas of the gap between the liquid crystal panel and the protective panel, curing light for the optical resin is illuminated on the entire surfaces to cure the optical resin.

RELATED TECHNICAL DOCUMENTS

Patent Documents

Patent Document 1: Japanese Laid-Open Patent Publication 2009-8851

SUMMARY OF THE INVENTION

Problem to be Solved by the Invention

The method is shown in FIG. 12, in which an optical resin is initially applied in the vicinity of an outer lateral side edge of a protective cover and semi-cured to form a dam, and the optical resin is further applied to bond the liquid crystal panel and the protective cover together. In this method, a dam forming step needs to be carried out before bonding the liquid crystal panel and the protective cover together, resulting in the increased number of process steps to be carried out to produce the liquid crystal display. A loader for forming the dam and another loader for bonding are needed, with the consequence that the producing device is complicated and bulky in size.

It is therefore an object of the present invention to provide a bonding device and a method for producing a bonded plate-shaped assembly, according to which the optical resin may be prevented from exuding from a gap between the liquid crystal panel and the protective cover without increasing the number of producing method steps or increasing the size or complexity of the device.

Means to Solve the Problem

To accomplish the above object, a device for bonding pair plate-shaped members together, according to the present invention, includes pair retaining base members for retaining the pair plate-shaped members facing each other, and a retaining base member movement unit for causing movement of the retaining base members towards and away from each other. The device according to the present invention also includes an illumination unit that illuminates curing light to a photo-curable liquid material charged between the pair plate-shaped members held by the pair retaining base members, and a sensor that detects the wetting-spreading state of the liquid material charged between the pair plate-shaped members. The illumination unit illuminates curing light to the liquid material charged and wetting-spread to near the outer lateral side edges of the pair plate-shaped members depending on the result of detection by the sensor.

A method for producing bonded plate-shaped assembly according to the present invention includes the steps of retaining pair plate-shaped members facing each other by pair retaining base members, and charging a photo-curable liquid material between the pair plate-shaped members facing each other. The method according to the present invention also includes the step of causing movement of the pair retaining base members by a retaining base member movement unit to cause the pair plate-shaped members to draw close to each other to cause wetting-spreading of the liquid material between the plate-shaped members. The method according to the present invention further includes the steps of detecting the wetting-spreading state of the liquid material by a sensor, and illuminating curing light, in response to the result of detection, to the liquid material wetting-spread to the entire surfaces of the pair plate-shaped members, such as to form the bonded plate-shaped assembly made up of the pair plate-shaped members bonded together.

Meritorious Effect of the Invention

According to the present invention, when the sensor has detected that the liquid material charged has wetting-spread to the vicinity of the outer lateral side edges, the illumination unit illuminates curing light to semi-fully or fully cure the liquid material that has become wetting-spread. Thus, according to the present invention, the liquid material charged may be spread out over the entire areas of the pair plate-shaped members, while the liquid material charged may be prevented from exuding from the gap between the two plates.

BRIEF DESCRIPTION OF THE DRAWINGS

FIG. 7A is a cross-sectional view showing a process step the liquid crystal panel is sucked onto a liquid crystal panel retaining base member and the protective panel is sucked onto a protective panel retaining base member.
FIG. 7B is a cross-sectional view showing a process step the emission nozzle is introduced into the gap between the liquid crystal panel and the protective panel.
FIG. 7C is a cross-sectional view showing a process step the liquid crystal panel retaining base member and the protective panel retaining base member are drawn close to each other to maintain the liquid crystal panel and the protective panel at a predetermined distance from each other.
FIG. 7D is a cross-sectional view showing a process step the adhesive is emitted from the emission nozzle.
FIG. 7E is a cross-sectional view showing a process step the emission nozzle is emitting the adhesive to draw a predetermined plot pattern.

FIG. 7F is a cross-sectional view showing a process step the emission nozzle is receded from the gap between the liquid crystal panel and the protective panel.
FIG. 7G is a cross-sectional view showing a process step the liquid crystal panel and the protective panel are thrust to spread out the adhesive.

BEST MODE FOR CARRYING OUT THE INVENTION

Figure 1:
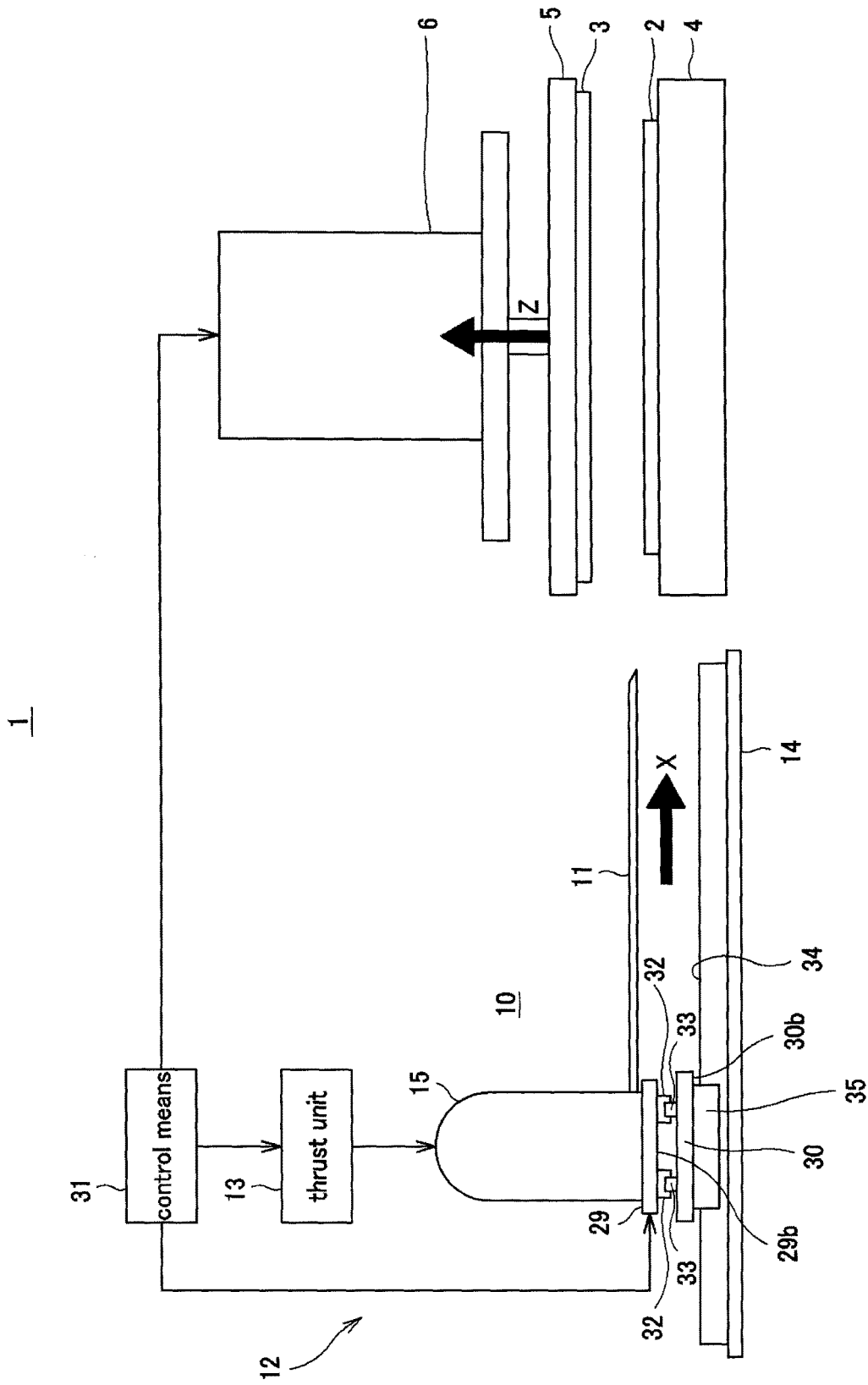
FIG. 1 is a side view showing a bonding device.

A bonding device and a method for producing a plate-shaped bonded assembly, according to the present invention, will now be explained in detail with reference to the drawings. In the bonding device 1, the plate-shaped members are a liquid crystal panel 2 and a protective panel 3 that protects the surface of the liquid crystal panel 2, for example, and an adhesive 7 is charged into the space between the liquid crystal panel 2 and the protective panel 3 to bond the two panels 2, 3 together to form the plate-shaped bonded assembly.

Figure 2:
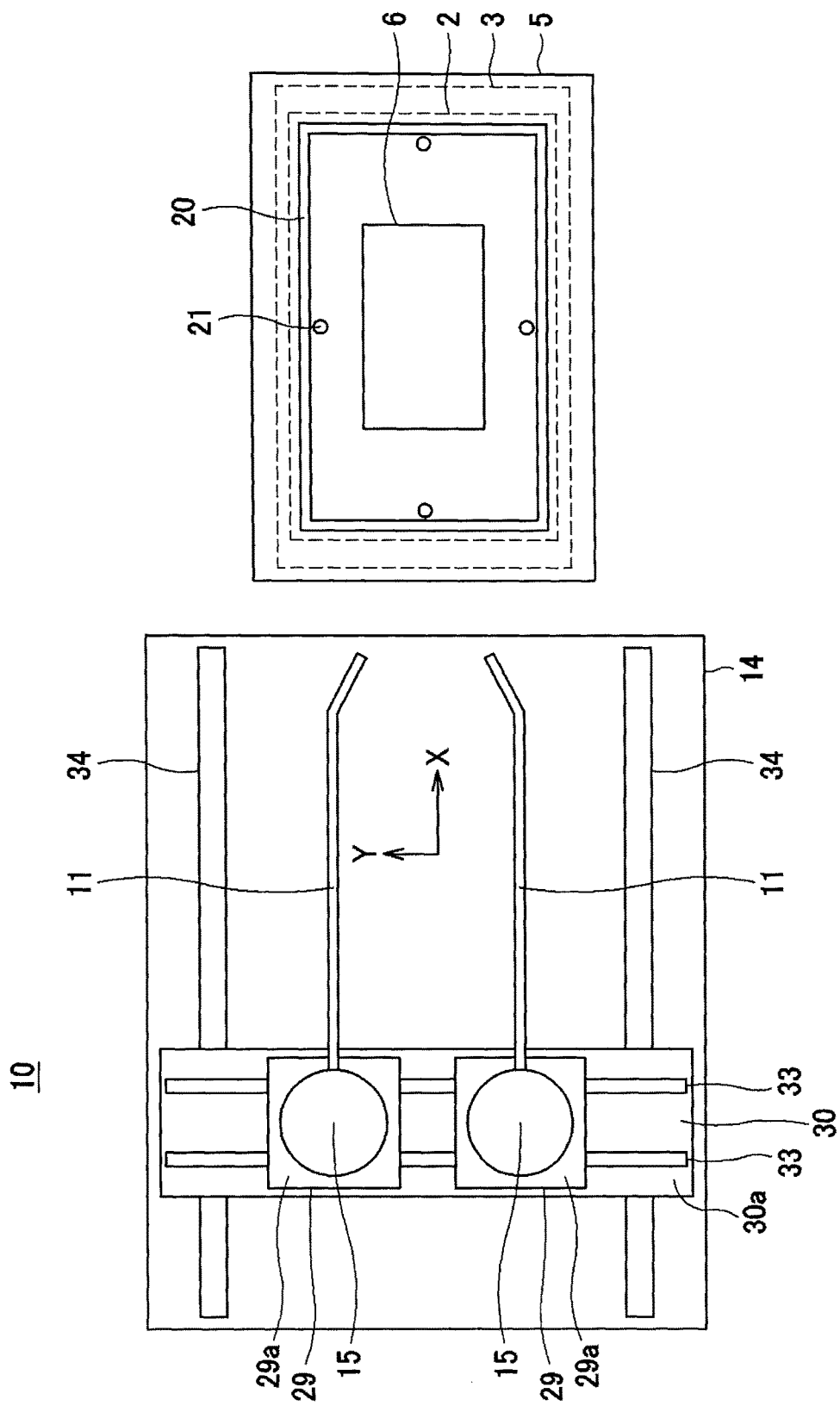
FIG. 2 is a plan view showing the bonding device.

Referring to FIGS. 1 and 2, the bonding device 1 includes a liquid crystal panel retaining base member 4 for retaining the liquid crystal panel 2, and a protective panel retaining base member 5 for retaining the protective panel 3. The bonding device also includes an actuator 6 for lifting and lowering the protective panel retaining base member 5 for moving the protective panel 3 towards and away from the liquid crystal panel 2. The bonding device also includes an illumination unit 8 for illuminating curing light to cure the adhesive 7 charged into the space between the liquid crystal panel 2 and the protective panel 3. The bonding device further includes a sensor 9 for detecting the wetting-spreading state of the adhesive 7 charged into the space between the liquid crystal panel 2 and the protective panel 3.

The bonding device 1 also includes a charging unit 10 that charges the adhesive into the space between the liquid crystal panel 2 and the protective panel 3. The charging unit 10 includes an emission nozzle 11 introduced into the space between the liquid crystal panel 2 and the protective panel 3 to emit the adhesive 7, and a nozzle movement unit 12 for causing movement of the emission nozzle 11. The charging unit further includes a syringe 15 adapted to store the adhesive 7 therein and connected to the emission nozzle 11, and a thrust unit 13 that emits the adhesive 7 via an emission opening 17 of the emission nozzle 11. These component parts are arranged on a table 14.

The liquid crystal panel 2 is a liquid crystal cell composed of two upper and lower substantially rectangular glass substrates between which is sealed a liquid crystal material. The protective panel 3 is bonded to one of the substrates facing the viewer. The protective panel 3, formed by a transparent plate of reinforced glass or an acrylic plate, improves the viewing performance of the liquid crystal panel 2 and protects it from impact or injuries.

The liquid crystal panel retaining base member 4, retaining the liquid crystal panel 2, retains the liquid crystal panel 2, by means such as vacuum suction, so that its bonding surface to the protective panel 3 is directed to the front side. The protective panel retaining base member 5, retaining the protective panel 3, is carried by the actuator 6 on top of the liquid crystal panel retaining base member 4, and retains the protective panel 3, by means such as vacuum suction, so that the bonding surface of the protective panel 3 with respect to the liquid crystal panel 2 directs to the front side. Additionally, the liquid crystal panel retaining base member 4 and the protective panel retaining base member 5 are set so that suction surfaces thereof to the liquid crystal panel 2 or the protective panel 3 are directed in a plumb-line direction. The major surfaces of the liquid crystal panel 2 and the protective panel 3 may thus be set in substantially the plumb-line direction.

Figure 3:
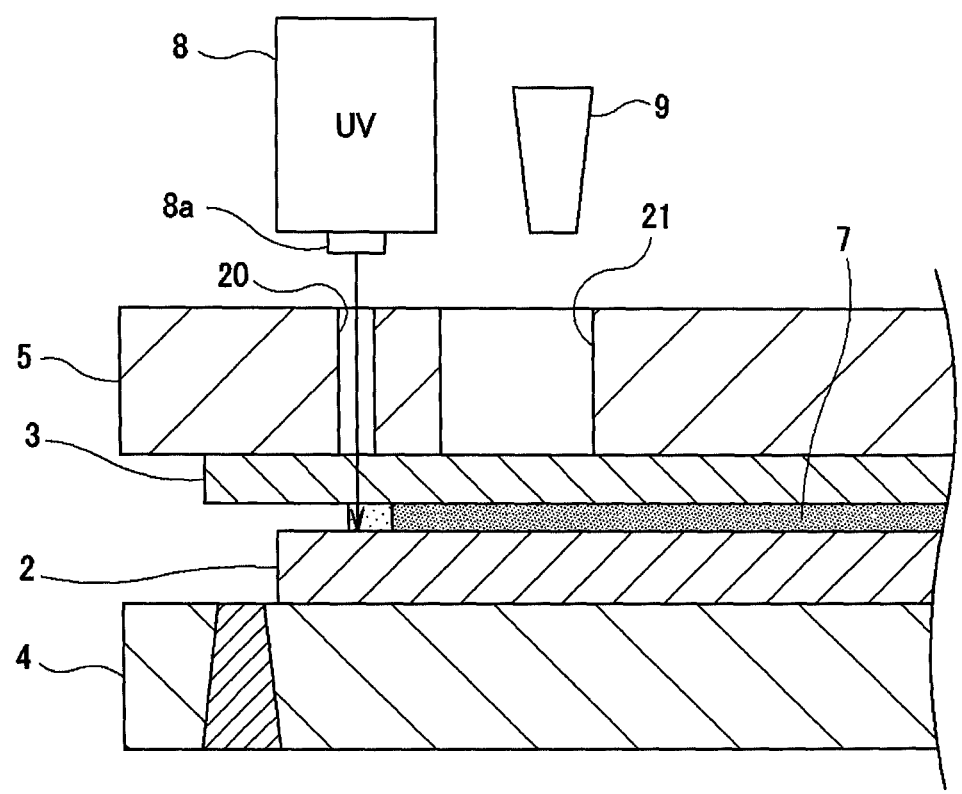
FIG. 3 is a cross-sectional view showing the bonding device.

A transparent light-transmitting part 20, through which a curing light beam, radiated from the illumination unit 8, may be transmitted, is provided in the protective panel retaining base member 5 in the vicinity of an outer lateral side of the protective panel 3, retained by the base member 5, as shown in FIG. 3. The light-transmitting part 20 is formed of a transparent material, such as quartz glass, or is formed by boring an opening via which the curing light beam is transmitted. The protective panel retaining base member 5 may be formed in its entirety of a transparent material, such as quartz glass, to transmit the curing light beam on a site in the vicinity of the outer lateral side of the protective panel 3.

Figure 4:
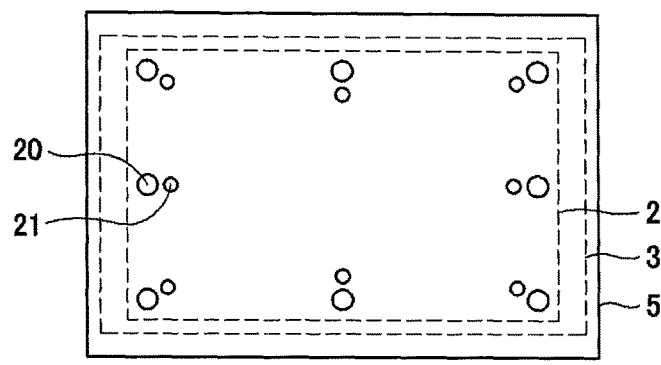
FIG. 4 is a plan view showing a modification of a protective panel retaining base member.

The light-transmitting part 20 is formed as a slit extending along the outer lateral side of the protective panel retaining base member 5. It is thus possible with the bonding device 1 to illuminate the curing light beam along the outer lateral side of the protective panel 3 to fully or semi-fully cure the adhesive 7 along the entire periphery of the protective panel 3. A plurality of light-transmitting parts 20 may also be provided at predetermined intervals along the outer lateral side of the protective panel retaining base member 5, as shown in FIG. 4. It is thus possible with the bonding device 1 to illuminate the curing light beam at predetermined intervals along the outer lateral side of the protective panel 3 to fully or semi-fully cure the adhesive 7 at predetermined intervals along the entire periphery of the protective panel 3. Moreover, by adjusting the intervals, it is possible to take advantage of turnaround or diffusion of the curing light beam to illuminate the curing light beam along the outer lateral side of the protective panel 3 to fully or semi-fully cure the adhesive 7 along the entire periphery of the protective panel 3.

Whether the light-transmitting part(s) 20 is formed along the entire outer lateral side or at predetermined intervals along the outer lateral side of the protective panel retaining base member 5, or the number or the shape of the light-transmitting part(s) 20 to be formed along the outer lateral side of the protective panel retaining base member 5, may be optionally determined depending on the size of the panels 2, 3, or intensity or wavelength of the curing light illuminated by the illumination unit 8.

The protective panel retaining base member 5 is provided with a sensor opening 21 which is located more radially inwardly than and in the vicinity of the light-transmitting part(s) 20. The sensor opening permits the sensor 9 to face the liquid crystal panel retaining base member 4 for the sensor 9 to detect the wetting spreading state of the adhesive 7. Like the light-transmitting part(s) 20, the sensor opening 21 is formed of a transparent material, such as quartz glass, or is formed as a boring to expose the sensor 9 towards the liquid crystal panel retaining base member 4. The protective panel retaining base member 5 may also be formed in its entirety of a transparent material, such as quartz glass, to permit the sensor 9 to be exposed towards the liquid crystal panel retaining base member 4.

The sensor opening(s) 21 is provided at a location(s) of the protective panel retaining base member 5 where the wetting-spreading state of the adhesive 7 is to be measured. For example, a plurality of the sensor openings 21 may be provided at predetermined intervals along the outer lateral side of the protective panel retaining base member 5. The sensor openings 21 may also be provided in the vicinity of each corner or a mid part of each side of the rectangular protective panel retaining base member 5. The locations or the number of the sensor openings 21 may optionally be determined depending on, for example, the viscosity or the coating pattern of the adhesive 7 charged into the gap between the liquid crystal panel 2 and the protective panel 3, the size of the liquid crystal panel 2 or the protective panel 3, or on the accuracy or the measurement method of the sensor 9.

The illumination unit 8 illuminates the curing light beam to the photo-curable adhesive 7. In case the adhesive 7 is a UV light curable resin, the illumination unit 8 is a UV illuminating device. The illumination unit 8 is provided on top of the protective panel retaining base member 5 directly above the light-transmitting part 20, and has an illumination part 8a directed towards the protective panel retaining base member 5 to illuminate the curing light beam thereto.

The illumination unit 8 may illuminate curing light beam as a spot or linearly. The illumination unit 8 may sweep the curing light along a side of the rectangular protective panel retaining base member 5 for illumination. In case the curing light is illuminated as a spot by the illumination unit 8, the light-transmitting part 20 is formed as a circle or a slit to transmit the curing light beam to pass therethrough. In case the curing light is illuminated linearly or in a sweeping manner, the light-transmitting part is formed as a slit.

The sensor 9, detecting the wetting-spreading state of the adhesive 7, charged into the gap between the liquid crystal panel 2 and the protective panel 3, senses that the adhesive has wetted ad spread to a predetermined location in the gap between the panels 2 and 3. Specifically, the sensor 9 may, for example, be a laser displacement sensor that emits laser light and receives its reflected light to measure changes in the volume of reflected light.

The sensor 9 receives laser light illuminated via the sensor opening 21 on the transparent protective panel 3 and reflected back from the liquid crystal panel 2. When the laser light illuminates the adhesive 7, reflected light is scattered by the adhesive 7, so that the volume of reflected light, received by the sensor 9, is decreased. This allows detection that the adhesive 7 has wetted and spread to the predetermined location in the gap between the panels 2 and 3.

Thus, in the bonding device 1, in which the sensor 9 and the sensor opening 21 are provided in the vicinity of the lateral side edge of the protective panel 3, retained by the protective panel retaining base member 5, it is possible to detect that the adhesive 7 has wettingly spread in the gap between the liquid crystal panel 2 and the protective panel 3 to close to the lateral side edges of the plates. On detection by the sensor 9 that the adhesive 7 has wetted and spread to a predetermined location, the illumination unit 8 illuminates the curing light to set the semi-cured or fully-cured state of the adhesive 7 that has wettingly spread to the predetermined location.

Thus, in the bonding device 1, the adhesive 7 is spread to each nich of the major surfaces of the liquid crystal panel 2 and the protective panel 3, as a result of the thrusting applied to the liquid crystal panel 2 and the protective panel 3. Additionally, the adhesive may be prevented from exuding out of the gap between the liquid crystal panel 2 and the protective panel 3. After the adhesive 7 is spread to the entire areas of the gap between the panels 2 and 3, the curing light is illuminated over the entire surface of the bonding device 1 to cure the adhesive 7.

The actuator 6, carrying the protective panel retaining base member 5, lifts or lowers the protective panel retaining base member 5 in an up/down direction corresponding to the arrow-Z direction or anti-arrow-Z direction indicated in FIG. 1. When the liquid crystal panel 2 or the protective panel 3 is to be retained by the base member 4 or 5, the actuator 6 lifts the protective panel retaining base member 5. When the adhesive 7 is to be charged into the gap between the liquid crystal panel 2 and the protective panel 3, the actuator 6 lowers the protective panel retaining base member 5.

In charging the adhesive 7, the actuator 6 lowers the protective panel retaining base member 5 to maintain the liquid crystal panel 2 and the protective panel 3 at a predetermined interval from each other such that an emission nozzle 11 may be introduced into the interval to permit the adhesive 7 to be applied as the adhesive is contacted with the panels 2, 3. After charging the adhesive 7, the actuator 6 further lowers the protective panel retaining base member 5 to thrust the panel 3 towards the panel 2 at a predetermined pressure for a predetermined time to spread the adhesive 7 over the entire surfaces of the panels 2, 3.

The charging unit 10 that charges the adhesive 7 into the gap between the liquid crystal panel 2 and the protective panel 3 will now be described.

The emission nozzle 11 that emits the adhesive 7 into the gap between the liquid crystal panel 2 and the protective panel 3 includes a tubular member having sides parallel to the major surfaces of the liquid crystal panel 2 retained by the base member 4 and the protective panel 3 retained by the base member 5. The emission nozzle 11 is connected to the syringe 15, which delivers the adhesive 7, and is thereby carried at such a height that allows the emission nozzle to be reciprocated in the gap between the panels 2, 3 without contacting these panels. The emission nozzle 11 is moved by the nozzle movement unit 12 in an anti-arrow-X direction in FIG. 1 and in an arrow-Y direction and an anti-arrow-Y direction in FIG. 2 to plot a predetermined emission pattern which will be explained subsequently.

Figure 5A:
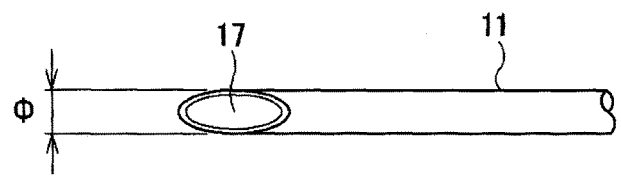
FIGS. 5A and 5B are a plan view and a side view, respectively, showing the foremost part of an emission nozzle.
Figure 5B:
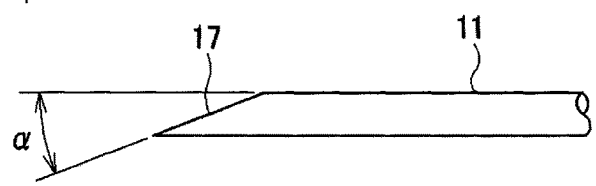
Figure 6:
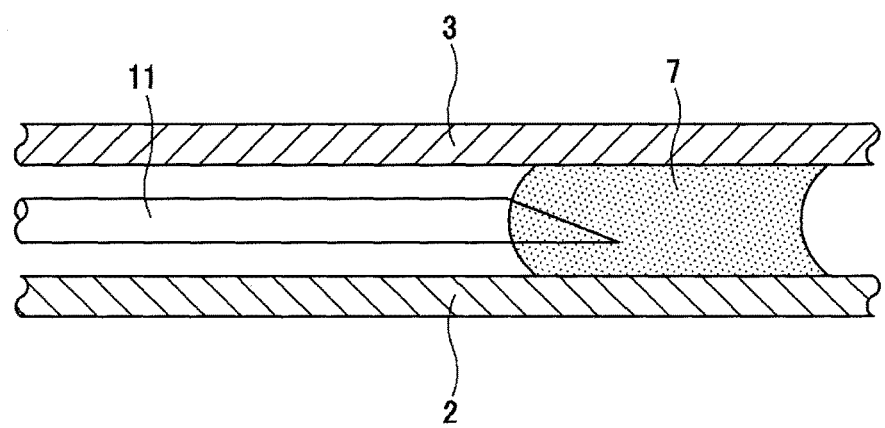
FIG. 6 is a cross-sectional view showing the emission nozzle as it is emitting the liquid material.

An upper surface of the foremost part of the emission nozzle 11 is bias-cut, as shown in FIGS. 5A and 5B, so that the emission opening 17 is directed upwards in the plumb-line direction. Thus, when the adhesive 7 starts to be emitted from the nozzle 11, the adhesive 7 is initially deposited onto the protective panel 3 disposed on an upper side, and subsequently is deposited by gravity onto the liquid crystal panel 2 disposed on the lower side. The emission nozzle 11 is moved in the gap between the liquid crystal panel 2 and the protective panel 3, as it emits the adhesive 7. The emission nozzle continues the coating operation as the adhesive 7 is deposited on the major surfaces of both the liquid crystal panel 2 and the protective panel 3, as shown in FIG. 6.

Thus, in the bonding device 1, the emission opening 17 is directed upwards to apply the adhesive 7 to the surfaces of both the liquid crystal panel 2 and the protective panel 3 at all times to prevent air foam from being left in the adhesive 7.

It is noted that the emission nozzle 11 has a diameter $\Phi$ such that 6 mm$\geq\Phi\geq$2 mm, as shown in FIG. 5A. This diameter $\Phi$ is determined depending on the gap size between the liquid crystal panel 2 and the protective panel 3 so that the nozzle will not be contacted with the panels 2 or 3. The emission nozzle 11 is formed of metal or plastics for industrial use and is sufficiently tough to emit the adhesive 7 without flexure. That is, the emission nozzle 11 coats the adhesive 7 without contacting with the liquid crystal panel 2 or the protective panel 3.

The emission nozzle 11 has an angle $\alpha$ of the emission opening 17 such that 90°>$\alpha\geq$30°, as shown in FIG. 5B. With the angle $\alpha$ larger than 90°, the adhesive 7 is unable to be deposited on the protective panel 3 at the beginning time of emission. Moreover, the adhesive 7 is left at the emission opening 17, while the adhesive tends to be deposited at unforeseen sites. With the angle $\alpha$ less than 30°, the adhesive 7 may hardly descend onto the lower side liquid crystal panel 2 at the beginning time of emission to give rise to the risk of entraining air foam. Specifically, the angle $\alpha$ is determined in a range of 90°>$\alpha\geq$30°, depending on the viscosity of the adhesive 7, so that the adhesive 7 will initially be deposited on the upper side protective panel 3 so as to be then deposited on the liquid crystal panel 2 without entraining air foam. That is, the angle $\alpha$ is set so that the adhesive 7 will be emitted as it is contacted with the two panels.

The nozzle movement unit 12 that causes movement of the emission nozzle 11 includes a first nozzle stage 29 on which the syringe 15 is loaded and a second nozzle stage 30 on which the first nozzle stage 29 is loaded. Specifically, the first nozzle stage 29 has an upper surface 29a on which the syringe 15 is mounted, and also has a second surface 29b on which a slider 32 is mounted. The first nozzle stage 29 may be moved in the arrow-Y direction and in the anti-arrow-Y direction by the slider 32 sliding on a first guide rail 33 provided on the second nozzle stage 30.

The second nozzle stage 30 has an upper surface 30a on which there is formed a first guide rail 33 to guide the first nozzle stage 29. The second nozzle stage also has a lower surface 30b on which there is provided a slider 35 that fits with a second guide rail 34 of the table 14. The second nozzle stage 30 may be moved in the arrow-X direction and in the anti-arrow-X direction in FIG. 1 by the slider 35 sliding on the second guide rail 34 formed on the table 14.

The bonding device 1 includes two first nozzle stages 29 to apply the adhesive 7 by two emission nozzles 11. The nozzle movement unit 12 includes a nozzle control means 31 to control the movement of the first nozzle stage 29 and the second nozzle stage 30. The emission nozzles 11 are moved substantially horizontally in association operatively with the lifting/lowering of the base members 4, 5 into or out of the gap between the liquid crystal panel 2 and the protective panel 3 without contacting with the two panels.

The bonding device 1 may be provided not only with two emission nozzles 11 but also with one or not less than three emission nozzles 11. In these cases, each of the emission nozzles 11 is connected with the syringe 15 mounted on the first nozzle stage 29 slidably carried by the second nozzle stage 30.

The adhesive 7 emitted via the emission nozzles 1 is stored in the syringe 15 loaded on the first nozzle stage 29. The syringe 15 is connected to the thrust unit 13 operative to emit the adhesive 7 stored therein such as to control the emission and emission stop of the adhesive 7 as well as to control the emission pressure. The thrust unit 13 is a vessel for dried compressed air and the nozzle control means 31 is used to control supply and supply stop of gas into the syringe 15 as well as to control the supply pressure. The gas is supplied at a predetermined pressure into the syringe 15 to emit the adhesive 7 out of the emission nozzle 11.

The adhesive 7 emitted via the emission nozzle 11 may be a transparent UV-curable elastic resin, the refractive index of which is controlled so that, when the adhesive has been charged into the gap between the panels 2, 3, light scattering is suppressed so as not to detract from viewing performance of the liquid crystal panel 2.

According to the present invention, the layer of cured resin formed by curing of the adhesive 7 in the gap between the panels 2, 3 has a transmittivity for visible light of not less than 90% and storage elastic modulus at 25° C. of less than $1.0 \times 10^7$ Pa and preferably $1 \times 10^3$ to $1 \times 10^6$ Pa. A resin composition used in forming the layer of cured resin preferably has a curing shrinkage of 5% or less, preferably 4.5% or less and more preferably from 0 to 2%.

Although there is no limitation to the raw material for the adhesive 7, a UV curable resin composition is preferably used for improving the productivity.

As the resin composition, such a resin composition containing one of polymers, one or more acrylate monomers and a photopolymerization initiator is preferably used. The polymers may be enumerated by, for example, polyurethane acrylate, polyisoprene based acrylate, esters thereof, terpene-based hydrogenated resins and butadiene polymers. The acrylate monomers may be enumerated by isobornyl acrylate, dicyclopentenyl oxyethylmethacrylate and 2-hydroxy butylmethacrylate. The photopolymerization initiator may, for example, be 1-hydroxy-cyclohexyl-phenyl-ketone.

There are many cases where the protective panel 3 has the function of cutting the UV range from the perspective of protecting the liquid crystal panel 2 from UV light. It is thus preferred to use in conjunction a photopolymerization initiator that may cure even in the visible range, such as SpeedCure TPO, a trade name of a product produced by Siber Hegner & Co.

The resin composition that forms the adhesive 7 has been pre-adjusted so that cured resin obtained on curing the resin composition by UV light illumination will have a storage elasticity modulus (25° C.) of less than $1.0 \times 10^7$ Pa and preferably $1 \times 10^3$ to $1 \times 10^6$ Pa, a refractive index of preferably not less than 1.45 and not more than 1.55 and more preferably not less than 1.51 and no more than 1.52 and transmittivity for visible light not less than 90% in case of the thickness of the layer of the cured resin of 100 μm. If principal resin components that make up the adhesive 7 are common but resin components or monomer components that are also contained to make up the adhesive 7 differ, there may be cases where the storage elasticity modulus (25° C.) exceeds $1.0 \times 10^7$ Pa. Such a resin composition that yields such cured resin may not be used as the resin composition that makes up the adhesive 7 used in the bonding device 1 to bond the liquid crystal panel 2 and the protective panel 3, as in the present embodiment.

The resin composition that composes the adhesive 7 has a curing shrinkage factor adjusted preferably to 5% or less, more preferably to 4.5% or less and most preferably to 0 to 2%. It is thus possible to reduce the internal stress accumulated in the cured resin when the resin composition is cured to prevent distortion at an interface between the layer of the cured resin and the liquid crystal panel 2 or the protective panel 3.

It is thus possible to reduce light scattering produced on an interface between the layer of the cured resin and the liquid crystal panel 2 or the protective panel 3 in case the adhesive 7 is interposed between the panels 2 and 3 and cured in situ. It is also possible to improve luminance of a picture image displayed and its viewing performance.

The degree of an internal stress accumulated in cured resin in the course of curing of the adhesive 7 may be evaluated by dripping the resin composition on a flat plate and measuring average surface roughness of the resin layer obtained on curing. Suppose that, in case 2 mg of a resin composition is dripped on the glass plate and cured on UV illumination at a curing ratio exceeding 90% to a cured resin product, the average surface roughness of the cured resin product is 6 nm or less. Also suppose that the same resin composition is interposed between a display part 2 and a protective part 3 and cured. The distortion produced in the resin composition may, in this case, be practically ignored. In the adhesive 7, the value of this average surface roughness may be made 6 nm or less, preferably 1 to 3 nm.

The adhesive 7 is of a viscosity such that the adhesive may be charged as it is deposited simultaneously on both the liquid crystal panel 2 and the protective panel 3 and remains deposited thereon without exuding from the lateral side edges of the two panels 2, 3. Such value of viscosity is selected and is in a range from 1000 mPa to 4000 mPa. In keeping with such viscosity of the adhesive 7, the gap between the liquid crystal panel 2 and the protective panel 3 is selected to be in a range from 3.5 mm to 10 mm.

The process for producing a bonded assembly of the liquid crystal panel 2 and the protective panel 3 using the above described bonding device 1 will now be described with reference to FIGS. 7 and 8. Although the present Example charges the adhesive 7 into a gap between the liquid crystal panel 2 and the protective panel 3 which are both rectangular-shaped, the shape of the liquid crystal panel 2 and the protective panel 3 is not limited to the rectangular shape.

Figure 8A:
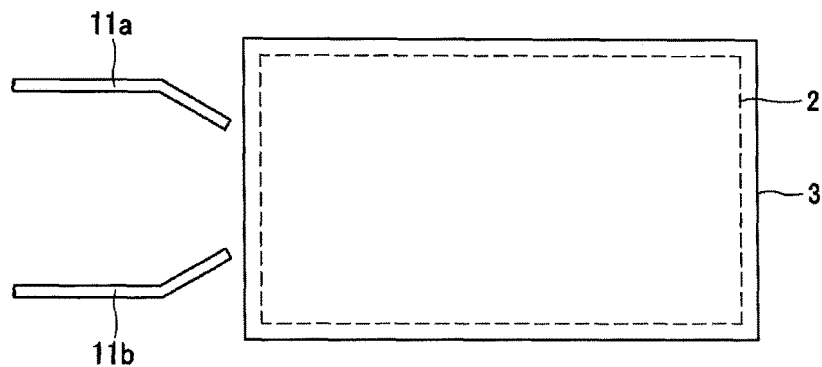
FIG. 8A is a plan view showing the state the liquid crystal panel is sucked onto the liquid crystal panel retaining base member and the protective panel is sucked onto the protective panel retaining base member.

Initially, in the bonding device 1, the liquid crystal panel retaining base member 4 and the protective panel retaining base member 5 are separated from each other by the actuator 6. The liquid crystal panel 2 is sucked by the liquid crystal panel retaining base member 4, while the protective panel 3 is sucked by the protective panel retaining base member 5 (FIGS. 7A and 8A). In the bonding device 1, the liquid crystal panel 2 and the protective panel 3 are made to register with each other, by known means, by way of performing position matching.

At this time, the first nozzle stage 29 is moved by the control means 31 in the anti-arrow-X direction in FIG. 1, so that the emission nozzle 11 is receded in the anti-arrow-X direction out of the gap between the liquid crystal panel 2 and the protective panel 3.

Figure 8B:
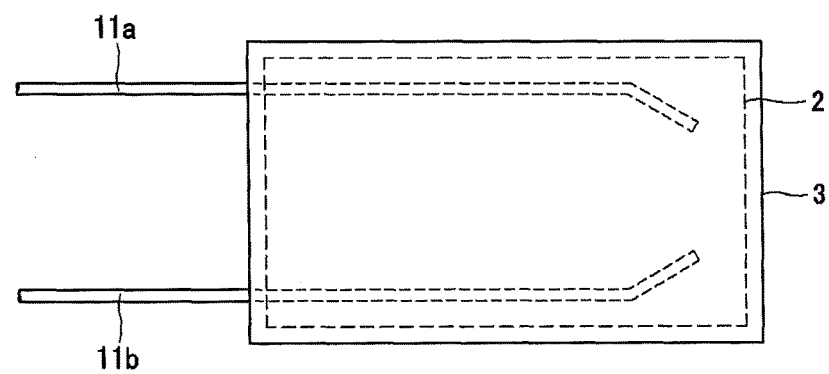
FIG. 8B is a plan view showing the state the emission nozzle is introduced in the gap between the liquid crystal panel and the protective panel.

After the position matching of the liquid crystal panel 2 and the protective panel 3, the control means 31 causes the two first nozzle stages 29 to be slid in the arrow-X direction. Each emission nozzle 11 may thus be introduced into the gap on one longitudinal lateral sides 2a, 3a of the two panels 2 and 3 (FIGS. 7B and 8B). At this time, the emission nozzle 11 is introduced at such a height that, when the two panels 2 and 3 draw close to each other, the emission nozzle 11 is not contacted with the two panels (FIG. 7B). The emission opening 17 of the emission nozzle 11 is positioned in the vicinity of the opposite longitudinal lateral sides 2b, 3b of the two panels 2 and 3 (FIG. 8B).

Then, in the bonding device 1, the actuator 6 is actuated to draw the liquid crystal panel retaining base member 4 and the protective panel retaining base member 5 towards each other to maintain the liquid crystal panel 2 and the protective panel 3 at a predetermined interval from each other (FIG. 7C).

Figure 8C:
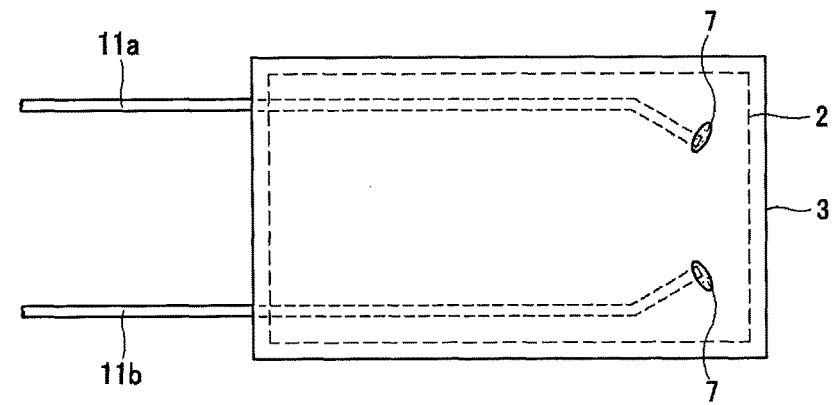
FIG. 8C is a plan view showing the state the adhesive is emitted from the emission nozzle.

Then, in the bonding device 1, the adhesive 7 is emitted from the emission nozzle 11, as the first and second nozzle stages 29, 30 are moved by the control means 31, to plot a predetermined charging pattern in the gap between the liquid crystal panel 2 and the protective panel 3 (FIG. 7D, FIG. 8C). At this time, the emission nozzle 11 emits the adhesive 7 as the nozzle is moved in the anti-arrow-X direction, arrow-Y direction and in the anti-arrow-Y direction. Hence, the emission opening 17 of the emission nozzle 11 is not intruded into the adhesive 7 charged into the gap between liquid crystal panel 2 and the protective panel 3 to prevent the adhesive 7 from becoming affixed to the main nozzle part. It is thus possible with the bonding device 1 to prevent the adhesive 7 from being deposited on the emission nozzle 11 and thence transferred and affixed to unforeseen sites.

Figure 8D:
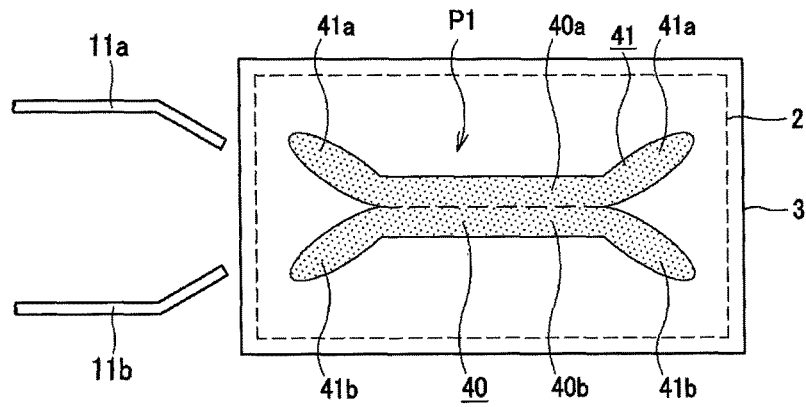
FIG. 8D is a plan view showing the state the emission nozzle is emitting the adhesive to draw a predetermined plot pattern.

The emission nozzle 11 has the upwardly directed emission opening 17, as described above. Thus, when the adhesive 7 commences to be emitted, the adhesive 7 is deposited on the protective panel 3 disposed above. The adhesive 7 then descends to become deposited to the liquid crystal panel 2 disposed below. The emission nozzle 11 continues to emit the adhesive 7 as it is moved in the arrow-X direction, arrow-Y direction and in the anti-arrow-Y direction to draw a predetermined plot pattern P1 (FIGS. 7E and 8D). Since the adhesive 7 from the emission nozzle 11 is applied as it is deposited on both the liquid crystal panel 2 and the protective panel 3, it is possible to prevent air foam from being left in the adhesive 7.

As a resin composition that forms the adhesive 7, such a resin composition composed of 70 parts by weight of an ester of a maleic acid anhydride adduct of a polyisoprene polymer and 2-hydroxyethylmethacrylate, 30 parts by weight of dicyclopentenyl oxyethyl methacrylate, 10 parts by weight of 2-hydroxybutyl methacrylate, 30 parts by weight of terpene-based hydrogenated resin, 140 parts by weight of a butadiene polymer, 4 parts by weight of a photopolymerization initiator and 0.5 part by weight of a photopolymerization initiator for visible light, and kneaded together by a kneader, was used.

Referring to FIG. 8D, the plot pattern P1 of the adhesive 7, charged into the gap between the liquid crystal panel 2 and the protective panel 3, is made up of a thick line part 40 and a fine line part 41 extending from both ends of the thick line part 40 towards four corners of the two panels 2, 3. The thick line part 40 is formed at a mid portion for extending along the longitudinal direction of the panels 2, 3. The thick line part 40 is formed at a mid portion for extending along the longitudinal direction of the panels 2, 3 and the fine line part 41 is formed in contiguity to both ends along the longitudinal direction of the thick line part 40 towards the four corners of the two panels 2, 3.

The plot pattern P1 is formed by one emission nozzle 11a and another emission nozzle 11b of the bonding device 1 drawing a symmetrical shape in the transverse direction in contiguity to the thick line part 40. That is, the one emission nozzle 11a plots one thick line part 40a and one fine line part 41a of the plot pattern P1, while the other emission nozzle 11b plots the other thick line part 40b and the other fine line part 41b of the plot pattern P1. Each of the two emission nozzles 11a, 11b is moved in synchronism with each other by the nozzle movement unit 12. Specifically, each emission nozzle is moved in a direction towards each other, that is, in the arrow-Y direction and in the anti-arrow-Y direction, as each emission nozzle is receded in the anti-arrow-X direction, to draw the fine-line part 41. Each emission nozzle is then receded in the anti-arrow-X direction to draw the thick line part 40. Each emission nozzle is further receded in the anti-arrow-X direction as each nozzle is moved in the arrow-Y direction or in the anti-arrow-Y direction, that is, in a direction away from each other, such as to draw the other fine line part 41.

It is possible for the emission nozzle 11 to separately plot the thick line part 40 and the fine line part 41 by setting the constant amount of emission of the adhesive 7 per unit time and by controlling the speed of movement of the first and second nozzle stages 29, 30. It is also possible with the bonding device 1 to draw the plot pattern P1 simultaneously to finish the coating of the adhesive 7 in short time by causing movement of the two emission nozzles 11a, 11b in synchronism with each other. It is moreover possible with the bonding device 1 to draw the symmetrically shaped plot pattern P1 to evenly charge the adhesive 7 over the entire areas of the two panels 2, 3.

It is supposed that the bonding device 1 is to draw the plot pattern P1 having the thick line part 40 and the fine line part 41. The thick line part 40 extends longitudinally at a mid portion of the liquid crystal panel 2 and the protective panel 3, while the fine line part 41 extends towards the four corners of the panels 2, 3. In this case, the sensor 9 is provided in the vicinity of each of the four corners and in the vicinity of a mid part of each of the four sides of the protective panel retaining base member 5 to check for the wetting spreading state of the adhesive 7. In the bonding device 1, the illumination unit 8 is provided in the vicinity of the setting position of the sensor 9, and the light-transmitting part 20 as well as the sensor opening 21 is provided in the protective panel retaining base member 5 depending on the positions of the illumination unit 8 and the sensor 9 (FIG. 4).

These positions of the illumination unit 8 and the sensor 9 are merely illustrative and different shapes may be selected for the plot pattern P1. Moreover, the pattern drawn by the bonding device 1 is not limited to the pattern P1 shown in FIG. 8D such that the plot pattern may be selected so that the air foam will not be mixed or the adhesive will be charged to the entire areas depending on the size of the panels 2, 3 or on the viscosity of the adhesive. In the bonding device, any suitable number or position of the illumination unit 8 or the sensor 9 may be selected for the pattern selected.

After drawing the plot pattern in the gap between the panels 2, 3, the control means 31 of the bonding device 1 actuates the first and second nozzle stages 29, 30 to recede the emission nozzle 11 out of the gap between the two panels 2, 3 (FIG. 7F).

Figure 8E:
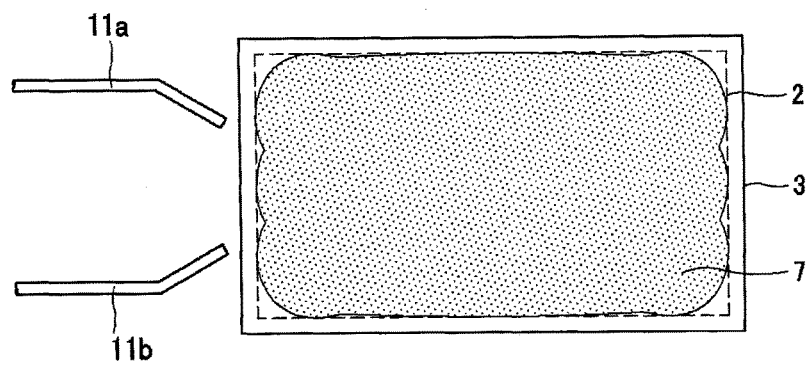
FIG. 8E is a plan view showing the state liquid crystal panel and the protective panel are thrust to spread out the adhesive.

Then, in the bonding device 1, the protective panel retaining base member 5 is lowered by the actuator 6 to thrust the panels 2, 3 to spread the adhesive 7 (FIG. 7G and FIG. 8E). In the bonding device 1, the plot pattern P1 has been drawn symmetrically at a mid part of the two panels 2, 3. Hence, the adhesive is spread evenly over the entire panel surfaces of the panels 2, 3. Since the fine line parts 41 are provided extending to the four corners of the two panels 2, 3, the adhesive 7 is positively spread to these corners. It is noted that the thrust force or the thrust time by the actuator 6 is determined depending on the gap between the panels 2, 3, or on the viscosity or the coating volume of the adhesive 7. For example, the thrust force and the thrust time are set at 2.5 kPa and at 0.3 sec, respectively.

The bonding device 1 then cancels the thrusting by the actuator 6, at the same time as it cancels suction of the liquid crystal panel 2 by the liquid crystal panel retaining base member 4 and that of the protective panel 3 by the protective panel retaining base member 5. The two panels are left under ambient pressure for e.g., five minutes, In the bonding device 1, the sensor 9 illuminates laser light via the sensor opening 21 towards the protective panel 3 to receive light reflected from the liquid crystal panel 2. When the adhesive 7 is wettingly spread to near the outer lateral side edge of the protective panel 3, laser light is illuminated on the so spread out adhesive 7 and reflected light is scattered. Hence, the volume of light received by the sensor 9 is decreased. In case decrease in the received light volume is detected by the sensor 9, the bonding device 1 causes the illumination unit 8 to illuminate curing light. Thus, in the bonding device 1, curing light is illuminated on the adhesive 7 wettingly spread out to a predetermined position in the vicinity of the outer lateral sides of the liquid crystal panel 2 and the protective panel 3 to cure or semi-cure the adhesive.

Figure 8F:
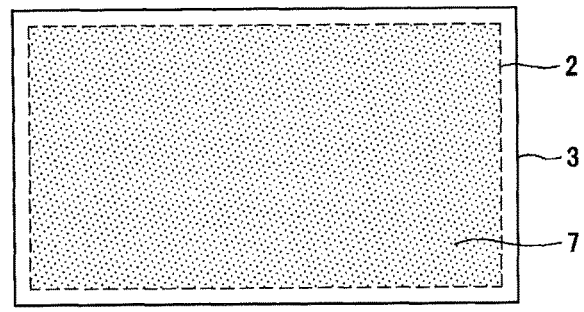
FIG. 8F is a plan view showing the state the adhesive is charged to the entire areas in the gap without exuding out of the gap.

Thus, with the bonding device 1, the adhesive 7 may be evenly charged over the entire area of the gap between the liquid crystal panel 2 and the protective panel 3, while being prevented from exuding out of the gap (FIG. 8F). If the adhesive 7 is semi-cured, it may blend in with the adhesive 7 to be illuminated with curing light in a subsequent step. If, on the other hand, the adhesive 7 is fully cured, it is possible to positively prevent the adhesive 7 from exuding out of the gap between the panels 2, 3.

In case the bonding device 1 is provided with a plurality of the illumination units 8 and a plurality of sensors 9, one or a plurality of the illumination unit(s) 8, operatively linked to the single sensor 9, illuminates curing light. That is, if the state of wetting and spreading out of the adhesive 7 differs from one location to another, and a certain sensor 9 has detected the arrival of the adhesive 7, one or multiple illumination unit(s) 8 operatively linked to the sensor 9, illuminates curing light.

Hence, in the bonding device 1, the illumination timing by the illumination unit(s) 8 may be varied from one site to another. However, in the bonding device 1, curing light is illuminated via the light-transmitting part(s) 20 provided in the protective panel retaining base member 5, and hence the extent of turnaround of curing light due to reflection or scattering is narrow. There is thus scarcely any risk that curing light is broadly illuminated to the adhesive 7 that has not arrived at a predetermined location for curing.

After the adhesive 7 has been charged over the entire areas of the gap, the curing light, such as UV light, not shown, is illuminated over the entire areas of the liquid crystal panel 2 and the protective panel 3 by the illumination unit. By so doing, the adhesive 7 is cured to complete the manufacture of the bonded assembly formed by the liquid crystal panel 2 and the protective panel 3 bonded together.

In the bonding device 1, the rate of spreading out of the adhesive 7 in the gap between the liquid crystal panel 2 and the protective panel 3 may be detected by the sensor 9. In this case, the bonding device 1 calculates, from the rate detected by the sensor 9, the time the adhesive 7 gets to a predetermined site in the vicinity of the outer lateral side edges of the panels 2, 3. The illumination unit 8 illuminates the curing light at the so calculated time.

In detecting the spreading rate of the adhesive 7, two laser displacement devices, emitting laser light and receiving the so emitted laser light to measure a change in the reflected light volume, may be used. These two devices detect that the adhesive 7 has arrived at two different detected positions. The spreading out rate of the adhesive 7 may then be indexed from the difference in detected timings and the distance between the two detected sites. The timing of illumination of curing light by the illumination unit 8 may be found by calculating the time the adhesive 7 gets to the predetermined site from the distance between the site of detection and the predetermined sites in the vicinity of the outer lateral side edges of the liquid crystal panel 2 and the protective panel 3 and the spreading-out rate of the adhesive 7.

Figure 9:
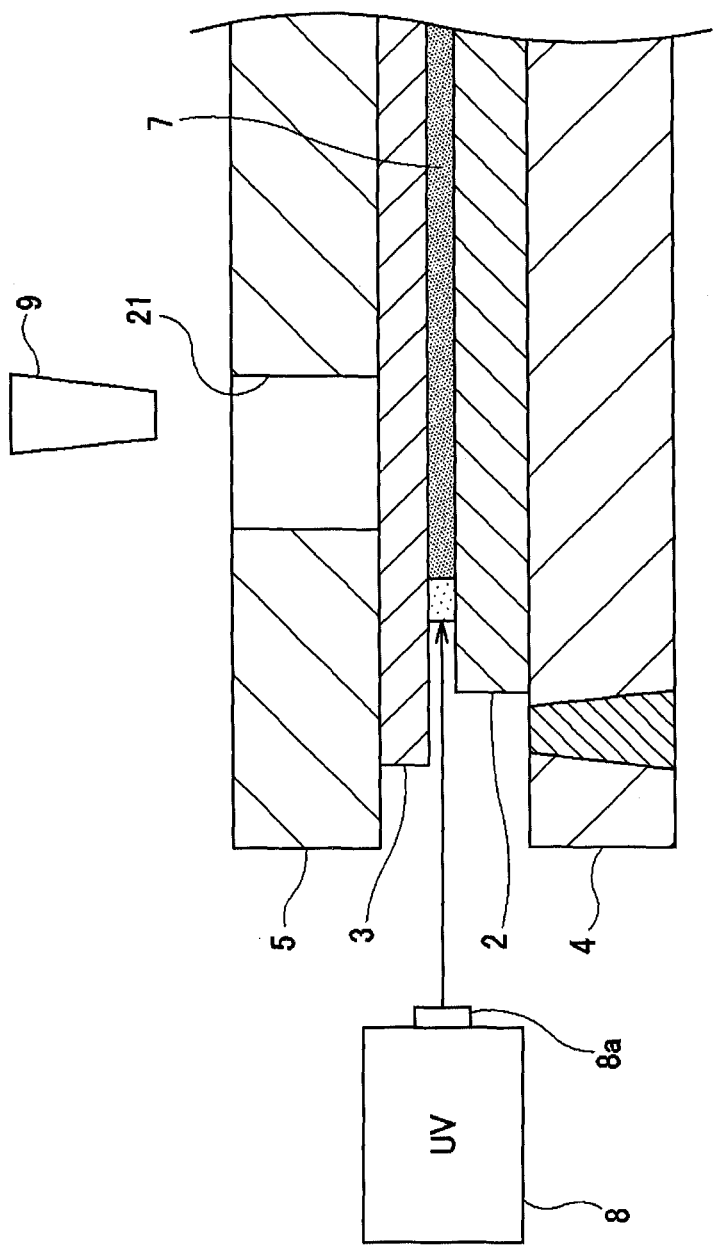
FIG. 9 is a side view showing a modification of the bonding device.

In the bonding device 1, the illumination unit 8, provided on top of the protective panel retaining base member 5, may illuminate curing light via the light-transmitting part(s) 20. Alternatively, the illuminating part 8a may be arranged adjacent to the gap between the liquid crystal panel 2 and the protective panel 3 to illuminate curing light in a direction parallel to the major surfaces of the panels 2, 3, as shown in FIG. 9.

That is, in the bonding device 1, the sensor opening 21 is provided in the protective panel retaining base member 5, and the sensor 9 that detects the wetting-spreading out state of the adhesive 7 is provided on top of the sensor opening 2. The sensor detects that the adhesive 7 has been wettingly spread to a predetermined site, or detects the spreading-out rate of the adhesive 7. When the bonding device 1 has detected that the adhesive 7 has been wettingly spread to the predetermined site, or has calculated the illuminating timing from the spreading-out rate of the adhesive, the illumination unit 8 illuminates curing light. The illumination unit 8 radiates curing light at the gap between the liquid crystal panel 2 and the protective panel 3 to illuminate the adhesive 7 to cure or semi-cure it.

In the present embodiment, the illuminating part 8a is directed to the gap between the liquid crystal panel 2 and the protective panel 3 in a transverse direction to illuminate curing light. If the illumination is premature, the adhesive 7 may be semi-fully or fully cured before being wettingly spread to the predetermined site. There is thus a risk that the adhesive 7 may not be charged to the entire areas of the liquid crystal panel 2 and the protective panel 3. If the bonding device is provided with a plurality of illumination units 8 and a plurality of sensors 9, and the illumination timing by the illumination units 8 is variable from one site to another, there is a risk that curing light illuminated from a given one of the illumination units 8 may attempt to illuminate the adhesive 7 not spread out to the illuminated site. Hence, high accuracy may be demanded in such case in setting the illumination timing by the sensor 9 than in case the curing light is illuminated via the light-transmitting part(s) 20 from above the protective panel retaining base member 5 as described above.

In the present embodiment, in which illuminating part 8a is arranged transversely adjacent to the gap between the liquid crystal panel 2 and the protective panel 3 to illuminate curing light in a direction parallel to the major surfaces of the panels 2, 3, the curing light may be illuminated in a manner different from spot light illumination. The manner of illumination may be selected with the different manner of designing of the illuminating part 8a. For example, the curing light may be illuminated as a slit or illuminated in a sweeping fashion along the sides of the liquid crystal panel 2 and the protective panel 3. It is thus possible with a single device to illuminate curing light highly efficiently.

In the bonding device 1, variations in the wetting spreading-out state of the adhesive 7 that may be produced from one site of the liquid crystal panel 2 and the protective panel 3 to another need to be eliminated. To this end, the bonding device 1 may be provided with an adjustment unit 50 to adjust the tilt of the liquid crystal panel retaining base member 4 and/or the protective panel retaining base member 5. The adjustment unit 50 changes the tilt of the liquid crystal panel retaining base member 4 and/or the protective panel retaining base member 5. By so doing, the adjustment unit 50 locally changes the distance between the panels 2, 3 to adjust the wetting spreading-out state of the adhesive 7 that might otherwise be variable from one site to another. It is thus possible with the bonding device 1 to prevent that the adhesive 7 gets prematurely to the predetermined location and that curing light is illuminated thereon at an earlier time than on other sites. As a result, it is possible to prevent that curing light is illuminated, due to reflection or scattering, on the adhesive 7 that has not arrived at the predetermined site.

Figure 10:
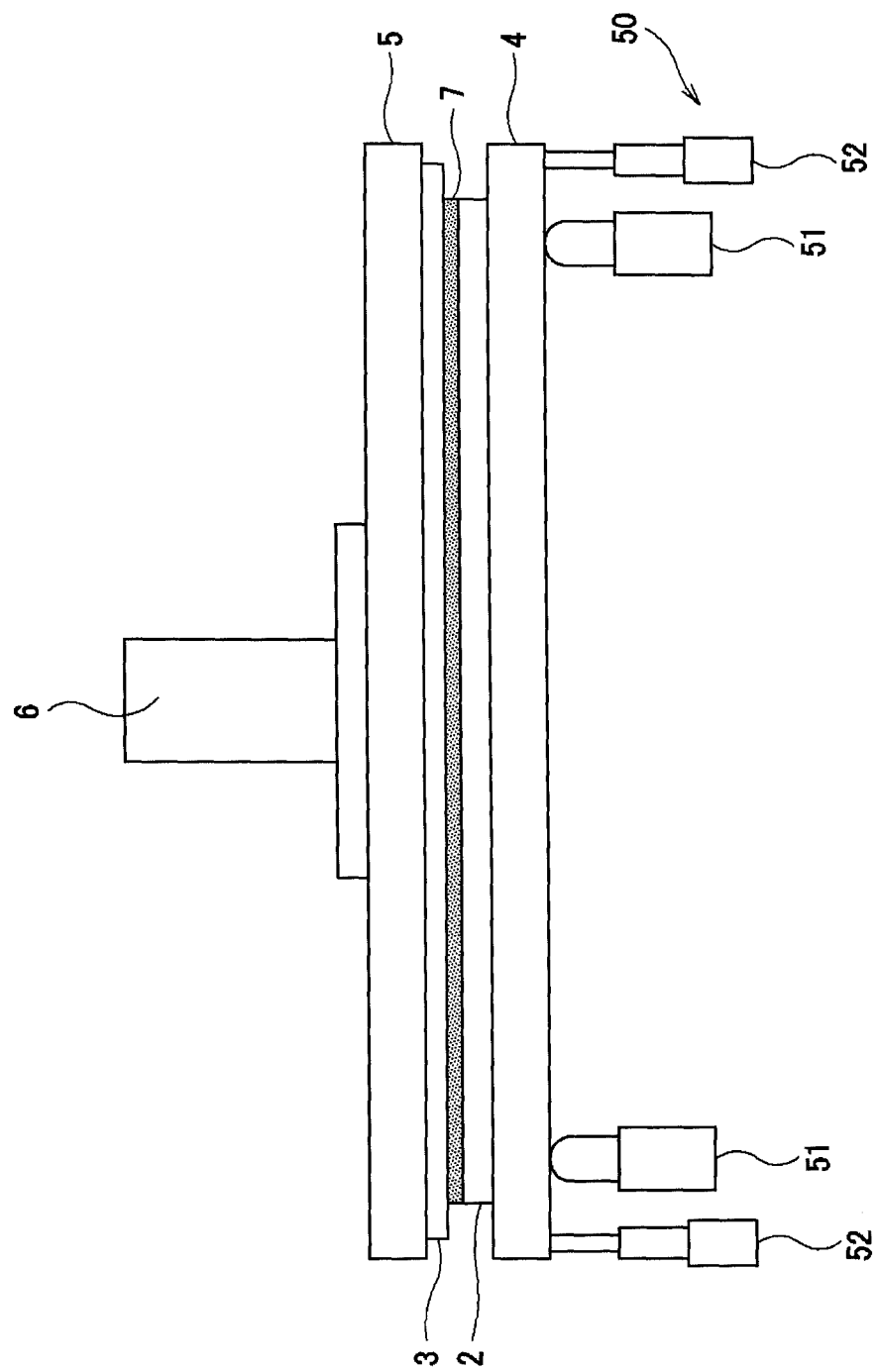
FIG. 10 is a side view showing an adjustment unit provided with an adjustment means.

The adjustment unit 50 includes a plurality of contact type digital sensors 51 and a plurality of tilt members 52, which tilt members 5 adjust relative tilt of the liquid crystal panel retaining base member 4 and the protective panel retaining base member 5 in response to the result of detection by the digital sensors 51 and the tilt members 52, as shown in FIG. 10. The contact type digital sensors 51 are provided at e.g., four corners of the liquid crystal panel retaining base member 4 such as to abut against the base member 4 from outside. The amounts of extension and contraction of the contact type digital sensors 51 are compared to one another to detect the tilt of the liquid crystal panel retaining base member 4 with respect to the protective panel retaining base member 5. Each tilt member 52 is provided with an actuator, not shown, and abutted against the liquid crystal panel retaining base member 4 at its four corners. The amounts of protrusion of the tilt members 52 are made to differ to adjust the relative tilt between the two panels 2, 3.

The adjustment unit 50 detects the wetting spreading out state of the adhesive 7 by the sensor 9. If variations are locally produced, the tilt member 52 is actuated to make fine adjustment of the tilt of the liquid crystal panel retaining base member 4 and/or the protective panel retaining base member 5 to locally change the distance between the liquid crystal panel 2 and the protective panel 3. By so doing, it is possible with the adjustment unit 50 to locally retard or quicken the wetting-spreading out rate of the adhesive 7 to provide for a substantially uniform wetting spreading out of the adhesive 7.

It is thus possible for the bonding device 1 to decrease variations in the curing light illumination timing for each illumination unit 8 to prevent that the curing light is illuminated to the adhesive 7 that has not arrived at the predetermined location in the vicinity of the outer lateral side edges of the liquid crystal panel 2 and the protective panel 3.

It is noted that, when the adhesive 7 has been charged to the four corner sites, the adjustment unit 50 adjusts the tilt of the liquid crystal panel retaining base member 4 and the protective panel retaining base member 5 before curing light is illuminated on the entire surfaces of the two panels 2, 3. This adjustment is made by the tilt member 52, as the relative tilt between the liquid crystal panel retaining base member 4 and the protective panel retaining base member 5 is monitored by the contact type digital sensor 51, so that the two panels 2, 3 will be parallel to each other.

In the adjustment unit 50, any suitable sensor capable of detecting the relative tilt between the liquid crystal panel retaining base member 4 and the protective panel retaining base member 5 may be used in place of the above mentioned contact type digital sensor 51. The adjustment unit 50 may use, as the tilt member 52, any suitable unit to make fine adjustment of the tilt of the liquid crystal panel retaining base member 4 and/or the protective panel retaining base member 5. The tilt unit used may be suitably designed in accordance with designing constraint of the bonding device 1.

Figure 11:
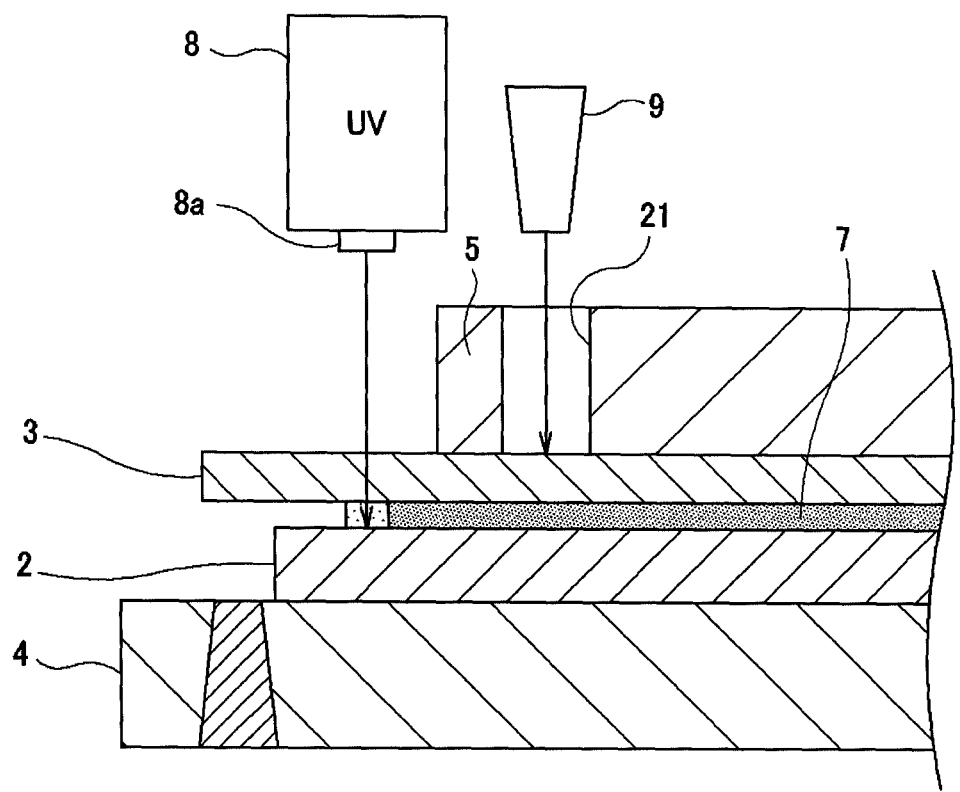
FIG. 11 is a cross-sectional view showing another modification of the bonding device.
Figure 12:
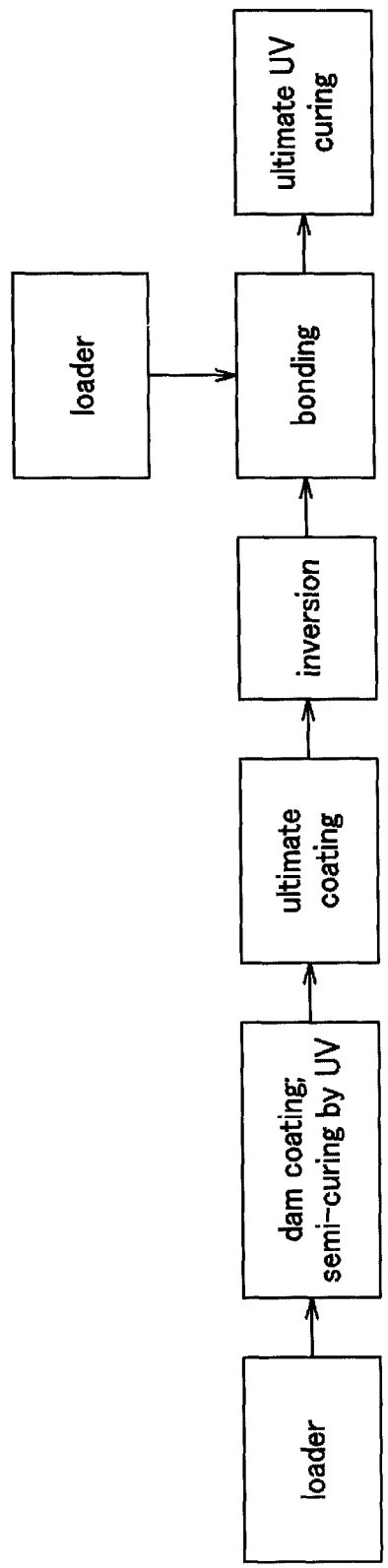
FIG. 12 is a block diagram for illustrating the bonding process in a conventional bonding device.

In the bonding device 1, the protective panel retaining base member 5 may be provided more inwardly than the outer lateral side edge of the protective panel 3, and the light-transmitting part(s) 20 may be omitted, as shown in FIG. 11. In the configuration shown in FIG. 11, it is unnecessary that the protective panel retaining base member 5 in the bonding device 1 is provided with the light-transmitting part(s) 20. Moreover, in the bonding device 1, the lateral surface of the protective panel retaining base member 5 may be used as a boundary of the illumination area by the curing light beam so that the lateral surface may be used as light barrier for the curing light.

The bonding device 1 may not be of the system of the above described type in which the liquid crystal panel 2 and the protective panel 3 face each other and in which the emission nozzle 11 is introduced into the gap between the panels 2, 3 to charge the adhesive 7 into the gap. For example, the bonding device may be configured so that, after the adhesive 7 is coated on the protective panel 3 or on the liquid crystal panel 2, the panel is topsy-turvied and affixed to the opposite side panel.

INDUSTRIAL UTILIZABILITY

The present invention may be applied not only to bonding of the liquid crystal panel 2 and the protective panel 3, but also to bonding of a plasma display and its protective panel. The present invention may also be applied to bonding of a variety of plate-shaped members, such as bonding of a protective panel and any of a variety of monitors, such as television sets, mobile phones, PDAs, portable game machines, digital still cameras, video cameras, digital photoframes, organic ELs or touch panels.

The invention claimed is:

1. A bonding device comprising:
a pair of plate-shaped members;
a pair of retaining base members that retains the pair of plate-shaped members facing each other;
a retaining base member movement unit that causes movement of the pair of retaining base members towards and away from each other;
an illumination unit that illuminates curing light to a photo-curable liquid material charged between the pair of plate-shaped members held by the pair of retaining base members; and
a sensor that detects a wetting spreading state of the liquid material charged between the pair of plate-shaped members,
wherein one of the pair of plate-shaped members is a transparent panel of a display device,
wherein one retaining base member of the pair of retaining base members comprises a sensor opening near outer lateral side edges of the one of the pair of plate-shaped members retained by the retaining base member, wherein the sensor illuminates laser light to one of the pair of plate-shaped members via the sensor opening, and wherein the illumination unit illuminates the curing light to the liquid material that is wettingly spread to near the outer lateral side edges of the pair of plate-shaped members, based on the result of detection by the sensor.

2. The bonding device according to claim 1, wherein the sensor detects that the liquid material charged has been wettingly spread to a predetermined site between the pair of plate-shaped members.

3. The bonding device according to claim 1, wherein the sensor detects a rate of wetting spreading of the liquid material charged.

4. The bonding device according to claim 1, further comprising an illuminating part disposed in a direction substantially normal to surfaces of the pair of plate-shaped members, wherein the illumination unit is provided in a vicinity of the outer lateral side edges of at least one of the pair of plate-shaped members.

5. The bonding device according to claim 4, wherein the retaining member provided with the illumination unit is capable of transmitting the curing light towards at least one of the pair of plate-shaped members.

6. The bonding device according to claim 1, wherein the illuminating part of the illumination unit is transversely directed to a gap between the pair of plate-shaped members to illuminate the curing light parallel to the pair of plate-shaped members.

7. The bonding device according to claim 1, wherein the retaining base member movement unit controls relative tilt of the pair of plate-shaped members to control the wetting spreading state of the liquid material charged.

8. The bonding device according to claim 1, further comprising:
   an emission nozzle introduced into a gap between the pair of plate-shaped members retained by the pair of retaining base members for facing each other, the emission nozzle emitting the liquid material charged;
   a nozzle movement unit that causes movement of the emission nozzle within the gap between the pair of retaining base members;
   a thrust unit that causes emission of the liquid material out of the emission nozzle; and
   a charging unit that coats the liquid material as the charging unit is contacted with the pair of plate-shaped members facing each other.

9. The bonding device according to claim 1, wherein the liquid material is wettingly spread by thrusting the pair of plate-shaped members.

* * * * *